United States Patent Office 3,208,947
Patented Sept. 28, 1965

3,208,947
THERMOELECTRIC COMPOSITIONS AND METHODS OF PREPARING SAME

Lothar H. Brixner, Brandywine Hills, Pa., assignor to E. I. du Pont de Nemours and Company, Wilmington, Del., a corporation of Delaware No Drawing. Filed Sept. 13, 1963, Ser. No. 308,676
9 Claims. (Cl. 252—62.3)

This invention relates to new thermoelectric materials and to methods for their preparation, and more particularly, it relates to new thermoelectric compositions of matter comprising the elements uranium, silicon and germanium in certain atomic proportions.

The individual compounds $USi_3$ and $UGe_3$ which are the forming components of the systems herein described are known and have been reported in the literature. These compounds crystallize in a simple cubic lattice and are isostructural. However, they do not possess good thermoelectric properties and are not suitable for use in devices where a Seebeck voltage is required nor in systems wherein current is generated at temperatures of the order of 1000–1500° C.

It is an object, therefore, of this invention to provide novel compositions of matter which exhibit valuble thermoelectric properties and which are solid solution derivatives of the binary silicides and germanides of uranium. It is also an object of this invention to provide thermoelectric materials which are useful in devices where a Seebeck voltage (thermocurrent) is required. It is a further object of this invention to provide thermoelectric materials which exhibit a high Seebeck coefficient at elevated temperatures, thus making these thermoelectric products exceptionally valuable in applications at temperatures as high as 1000–1500° C. It is still a further object of this invention to provide thermoelectric materials which exhibit a low thermal conductivity at elevated temperatures.

It has been discovered that novel thermoelectric compositions of matter can be prepared by heating a mixture of uranium, silicon and germanium in certain atomic proportions until the X-ray diffraction pattern indicates an absence of lines characteristic of the starting components. This result is obtained when the components are heated at a temperature of from about 1000–1400° C. for about 10 to 40 hours. The resulting novel thermoelectric compositions that are produced by this process can be represented by the formula:

$$USi_xGe_{3-x}$$

wherein $x$ has a value from 0.5 to 2.5 inclusive.

In a preferred embodiment of this invention the thermoelectric compositions are prepared by powder metallurgical techniques wherein the constituent elements, namely, uranium, silicon and germanium are mixed in the atomic proportions indicated in the above formula and sealed in quartz ampoules. These quartz ampoules are heated to approximately 1200° C. until completion of the reaction is assured by X-ray diffraction patterns indicating an absence of lines characteristic of the starting components in the resulting product. The time of treatment to complete the reaction at this temperature will normally be about 20 hours. An alternative embodiment of the process of the invention comprises arc melting the components, uranium, silicon and germanium in an inert atmosphere in the atomic proportions indicated in the above formula. This process provides a completely reacted homogeneous product.

In order to get a desirable shape, preferably, the arc melted buttons are comminuted, pressed and reheated or resintered at 1200–1400° C. for 1–3 hours in order to give the product added strength.

The products of this invention can be prepared from the elements per se making up the composition. However, it is understood that one may start with a compound such as $USi_3$ and blend it with germanium and a corresponding amount of uranium. It is pointed out that the heating step may be interrupted to comminute and press the composition being treated, followed by reheating, thereby improving the properties of firmness and density of the product.

The products are characterized by being conductors of electricity, possess thermal stability at temperatures of at least 1200–1500° C., exhibit low thermal conductivity, and exhibit a large Seebeck effect, especially in the temparture range of 1000–1500° C. All the products prepared as described herein have a figure of merit at room temperature of at least $0.5\times10^{-4}$ per degree and preferred products have a figure of merit of at least $0.7\times10^{-3}$ per degree at 1200° C. The figure of merit for thermoelectric materials takes into account the fact that low resistivity and low thermal conductivity as well as high Seebeck coefficient are necessary for a good thermoelectric material. The equation for calculating the figure of merit is as follows:

$$Z(\text{figure of merit in } ^\circ\text{ C.}^{-1})=\frac{S^2}{rk}$$

where $r$ is resistivity in ohm-cm., $k$ is the thermal conductivity in watts per centimeter degree, and S is the Seebeck coefficient in volts per degree centigrade.

The following examples will illustrate, but not limit, the invention.

EXAMPLE 1

This example describes the preparation and properties of the thermoelectric material of chemical composition $USi_{0.5}Ge_{2.5}$. The preparation was carried out as follows: 10.000 grams of uranium, 7.624 grams of germanium and 0.590 gram of silicon were thoroughly mixed and were arc melted to form a button under an argon atmosphere. This button was crushed in an agate mortar, and the resulting powder was cold-pressed into a bar ¼" x ¼" x 2" at 50 t.s.i. The bar obtained in this fashion exhibited a density 60–70% of theoretical, and did not have great green strength. Therefore, the pressed bar was placed in a water cooled copper boat and sintered by inductively heating. The sintering temperature of about 1400° C. was held just below the melting point of the material for about 1–2 hours. From this sintering an exceptionally strong compact with the density of 95–98% of theoretical was obtained. Structural and electrical characteristics of this product were examined and these are reported in Tables I and II which follow.

The sintered bar was examined by X-ray diffraction procedures and was found to crystallize in a cubic structure with $a_0$=4.153 A. There were no lines of the starting components observed by this analysis.

EXAMPLE 2

Using the same procedure as is given in Example 1 a thermoelectric material of chemical formula $USiGe_2$ was prepared as follows: 10.000 grams uranium, 1.180 grams silicon, and 6.100 grams germanium were thoroughly mixed and were arc melted to form a button under an argon atmosphere and further crushed, compacted and reheated as described in Example 1. The product was examined by X-ray diffraction procedures and no characteristic lines of the original components were observed. Structural and electrical characteristics of this product were examined and they are reported in Tables I and II which follow.

EXAMPLE 3

To form a thermoelectric material having the formula $USi_{1.5}Ge_{1.5}$, powder metallurgical techniques were employed as follows: 10.000 grams of uranium powder, 1.770 grams silicon powder, and 4.574 grams of germanium, were mixed by placing them in a small quartz ampoule and thoroughly shaking the ampoule. This ampoule was then heated in a furnace at a temperature of 1200° C. for 14 hours. At the end of this heating period the ampoule was cooled and the powder removed from the ampoule and ground in an agate mortar. The powder was then pressed into a bar ¼" x ¼" x 2" at 50 t.s.i. and was resintered in an argon atmosphere at 1200° C. for 14 hours. The sintered bar was cooled in the argon atmosphere and examined by X-ray diffraction procedures. No lines of the original constituents were observed. The electrical and structural characteristics of this product are given in Tables I and II below.

EXAMPLE 4

Using the same procedure as is given in Example 1, a thermoelectric material having the formula $USi_2Ge$ was prepared by melting together 10.000 grams uranium, 2.36 grams of silicon, and 3.050 grams germanium. In the same manner as is given above, the product of this reaction was studied by X-ray diffraction procedures. No lines of the original constituents were observed. Again the structural and electrical characteristics for this composition were obtained and they are summarized in Tables I and II below.

EXAMPLE 5

Using the same procedure as is given in Example 1, a thermoelectric material having the formula $USi_{2.5}Ge_{0.5}$ was prepared by melting together 12.000 grams uranium, 3.54 grams silicon, and 1.830 grams germanium. The product was examined by X-ray diffraction procedures and no lines of the original components were observed. The electrical and structural data for the composition which was thus prepared are given below in Tables I and II.

*Table I.—Electrical properties of the products*

| Example | Composition | Electrical Resistivity at Room Temperature in μΩcm. | Room Temperature, Seebeck Coefficient in μv./deg. C. |
|---|---|---|---|
| 1 | $USi_{0.5}Ge_{2.5}$ | 53 | +14 |
| 2 | $USiGe_2$ | 49 | +17 |
| 3 | $USi_{1.5}Ge_{1.5}$ | 51 | +19 |
| 4 | $USi_2Ge$ | 43 | +17 |
| 5 | $USi_{2.5}Ge_{0.5}$ | 41 | +18 |

| Example | Composition | Electrical Resistivity at 1200° C. in μΩcm. | Seebeck Coefficient in μv./deg. at 1,200° C. |
|---|---|---|---|
| 1 | $USi_{0.5}Ge_{2.5}$ | 235 | +98 |
| 2 | $USiGe_2$ | 211 | +95 |
| 3 | $USi_{1.5}Ge_{1.5}$ | 195 | +87 |
| 4 | $USi_2Ge$ | 178 | +69 |
| 5 | $USi_{2.5}Ge_{0.5}$ | 164 | +66 |

*Table II.—Crystallographic parameters of products*

| Example | Composition | $a_0$ A. |
|---|---|---|
| 1 | $USi_{0.5}Ge_{2.5}$ | 4.170 |
| 2 | $USiGe_2$ | 4.153 |
| 3 | $USi_{1.5}Ge_{1.5}$ | 4.128 |
| 4 | $USi_2Ge$ | 4.104 |
| 5 | $USi_{2.5}Ge_{0.5}$ | 4.081 |

The resistivity of the compositions given in Examples 1 through 5 was measured by the two point method. For the room temperature Seebeck voltage measurement the bar was butted between two copper blocks (machined from the same piece of stock) maintained at different temperatures. The temperatures were measured at approximately the cross-sectional center of the bar immediately behind the contact faces. The room temperature Seebeck coefficient was measured with a temperature differential of about 10° C. The high temperature measurements were made in a similar manner, but using platinum in place of copper.

The examples given above are representative of the products that may be made according to this invention. However, many other variations are possible, since the components systems $USi_3$ and $UGe_3$ are isostructural and crystallize in a simple cubic lattice. Thus, it will be observed that although compositions have been prepared in which the value of $x$ in the formula $USi_xGe_{3-x}$ ranges from 0.5 to 2.5, other variations in composition are entirely possible.

The X-ray data obtained on each of the examples of this invention indicate that complete solid solubility exists for the constitutent components and that the products are single phase materials.

The compositions of matter of this invention are useful in generating electric current directly from thermal energy without reliance upon mechanical parts. They are particularly useful for generating electric current at very high temperatures in the range of 1000° C. to 1500° C. or even higher. Thermoelectric generators are well known in the art, and thermoelectric elements of a size and shape to fit any particular generator can be prepared from the products of this invention by compacting them into the desired shape and size preferably before they are sintered.

Since it is obvious that many changes and modifications can be made in the above described details without departing from the nature and spirit of the invention, it is to be understood that the invention is not to be limited to said details except as set forth in the appended claims.

I claim:

1. A thermoelectric composition of matter having the formula $USi_xGe_{3-x}$, wherein $x$ has a value of from 0.5 to 2.5.

2. A thermoelectric composition of matter having the formula $USiGe_2$.

3. A thermoelectric composition of matter having the formula $USi_{1.5}Ge_{1.5}$.

4. A thermoelectric composition of matter having the formula $USi_2Ge$.

5. A thermoelectric composition of matter having the formula $USi_{2.5}Ge_{0.5}$.

6. A thermoelectric composition of matter having the formula $USi_{0.5}Ge_{2.5}$.

7. A process for the production of thermoelectric compositions of matter having the general formula $USi_xGe_{3-x}$ wherein $x$ has a value of from 0.5 to 2.5 inclusive; said process comprising heating the constituent elements in the atomic proportions according to said formula until the X-ray diffraction pattern indicates an absence of lines characteristic of the starting components.

8. A process for the production of thermoelectric compositions of matter having the general formula $USi_xGe_{3-x}$ wherein $x$ has a value of from 0.5 to 2.5 inclusive; said process comprising heating at temperatures of from about 1000–1400° C. for about 10 to 40 hours a mixture of the constituent elements in the atomic proportions according to said formula.

9. A process for the production of thermoelectric compositions of matter having the general formula $USi_xGe_{3-x}$, wherein $x$ has a value of from 0.5 to 2.5 inclusive; said process comprising arc melting in an inert atmosphere a mixture of the constituent elements in the atomic proportions according to said formula, comminuting, pressing and reheating the composition at about 1200–1400° C. for about 1 to 3 hours.

No references cited.

CARL D. QUARFORTH, *Primary Examiner.*